United States Patent
Iranzo Molinero

(10) Patent No.: US 10,002,995 B2
(45) Date of Patent: Jun. 19, 2018

(54) MULTIPLE TRANSMISSION WINDOWS FOR OFDM SYMBOL

(71) Applicant: Marvell World Trade Ltd., St. Michael (BB)

(72) Inventor: Salvador Iranzo Molinero, Valencia (ES)

(73) Assignee: Marvell World Trade Ltd., St. Michael (BB)

( * ) Notice: Subject to any disclaimer, the term of this patent is extended or adjusted under 35 U.S.C. 154(b) by 238 days.

(21) Appl. No.: 14/481,649

(22) Filed: Sep. 9, 2014

(65) Prior Publication Data

US 2015/0071050 A1    Mar. 12, 2015

Related U.S. Application Data

(60) Provisional application No. 61/875,356, filed on Sep. 9, 2013.

(51) Int. Cl.
*H01L 33/60* (2010.01)
*H01L 33/10* (2010.01)
(Continued)

(52) U.S. Cl.
CPC .......... *H01L 33/60* (2013.01); *H01L 25/0753* (2013.01); *H01L 33/10* (2013.01);
(Continued)

(58) Field of Classification Search
None
See application file for complete search history.

(56) References Cited

U.S. PATENT DOCUMENTS 6,985,715 B2    1/2006 Lee
7,206,367 B1    4/2007 Moore
(Continued)

FOREIGN PATENT DOCUMENTS

CN    101091342 A    12/2007
EP     0975097 A2    1/2000
(Continued)

OTHER PUBLICATIONS

IEEE Std 802.11af/D1.05 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: TV White Spaces Operation," *The Institute of Electrical and Electronics Engineers, Inc.*, pp. 1-123 (Nov. 2011).

(Continued)

*Primary Examiner* — Jeffrey M Rutkowski
*Assistant Examiner* — Mandish Randhawa

(57) ABSTRACT

A plurality of information bits are mapped to: (i) a first plurality of constellation symbols corresponding to a first plurality of OFDM subcarriers in an OFDM symbol, and (ii) a second plurality of constellation symbols corresponding to a second plurality of OFDM subcarriers in the OFDM symbol. A first time-domain signal is generated by performing an IDFT based on the first plurality of constellation symbols. A second time-domain signal is generated by performing an IDFT based on the second plurality of constellation symbols. The first time-domain signal is modified by applying a first windowing function corresponding to a first transition width β1. The second time-domain signal by applying a second windowing function having a second transition width β2. An output signal is generated to include a sum of the first time-domain signal and the second (Continued)

time-domain signal, the output signal corresponding to the OFDM symbol.

12 Claims, 4 Drawing Sheets

(51) Int. Cl.
*H04L 27/26* (2006.01)
*H04L 25/03* (2006.01)
*H01L 25/075* (2006.01)

(52) U.S. Cl.
CPC .... *H04L 25/03828* (2013.01); *H04L 27/2602* (2013.01); *H04L 27/263* (2013.01); *H04L 27/2614* (2013.01); *H04L 27/2626* (2013.01); *H01L 2924/0002* (2013.01); *H01L 2933/0033* (2013.01); *H01L 2933/0058* (2013.01)

(56) References Cited

U.S. PATENT DOCUMENTS

| | | |
|---|---|---|
| 7,483,365 B2 | 1/2009 | Blasco Claret et al. |
| 8,265,176 B2 | 9/2012 | Blasco Claret et al. |
| 8,587,159 B2 | 11/2013 | Torres Canton et al. |
| 2002/0010870 A1 | 1/2002 | Gardner |
| 2005/0113045 A1 | 5/2005 | Santhoff et al. |
| 2006/0189335 A1 | 8/2006 | Hara et al. |
| 2007/0058739 A1 | 3/2007 | Aytur et al. |
| 2007/0254693 A1 | 11/2007 | Furukawa |
| 2007/0280160 A1 | 12/2007 | Kim et al. |
| 2008/0006310 A1 | 1/2008 | Munstermann et al. |
| 2008/0232517 A1 | 9/2008 | Terabe et al. |
| 2009/0296839 A1* | 12/2009 | Stadelmeier .......... H04L 5/0007 375/260 |
| 2010/0002675 A1 | 1/2010 | Fu et al. |
| 2010/0061438 A1* | 3/2010 | Tan ...................... H04L 1/0003 375/227 |
| 2010/0080317 A1 | 4/2010 | Narasimhan et al. |
| 2010/0284446 A1 | 11/2010 | Mu et al. |
| 2011/0033007 A1 | 2/2011 | Zerbe et al. |
| 2012/0134375 A1 | 5/2012 | Blasco Claret et al. |
| 2012/0307917 A1 | 12/2012 | Goldhamer |
| 2013/0129017 A1 | 5/2013 | Sahin et al. |
| 2013/0343446 A1* | 12/2013 | Eliaz ................... H04L 27/2628 375/230 |
| 2014/0233526 A1 | 8/2014 | Molinero |
| 2015/0071050 A1 | 3/2015 | Iranzo Molinero |
| 2016/0081105 A1* | 3/2016 | Mizusawa ............. H04J 11/005 370/281 |

FOREIGN PATENT DOCUMENTS

| | | | |
|---|---|---|---|
| EP | 1388954 A2 | 2/2004 | |
| EP | 1770870 A1 | 4/2007 | |
| EP | 2302818 A1 | 3/2011 | |
| GB | 2454513 A * | 5/2009 | ............ H04B 1/719 |
| WO | WO-2004/100392 A1 | 11/2004 | |
| WO | WO-2007/039723 A1 | 4/2007 | |
| WO | WO-2009/054547 A2 | 4/2009 | |
| WO | WO-2010/010216 A1 | 1/2010 | |
| WO | WO-2011/001430 A2 | 1/2011 | |

OTHER PUBLICATIONS

IEEE Std 802.11ah™/D1.0 "Draft Standard for Information Technology—Telecommunications and information exchange between systems Local and metropolitan area networks—Specific requirements, Part 11: Wireless LAN Medium Access Control (MAC) and Physical Layer (PHY) specifications: Amendment 6: Sub 1 GHz License Exempt Operation," *The Institute of Electrical and Electronics Engineers, Inc.*, pp. 1-394 (Oct. 2013).
IEEE Std 802.16™—2012 (Revision of IEEE Std. 802.16-2009), IEEE Standard for Air Interface for Broadband Wireless Access Systems: Part 1—Beginning through Section 7, IEEE Computer Society and the IEEE Microwave Theory and Techniques Society, *The Institute of Electrical and Electronics Engineers, Inc.*, ; 2558 pages (Aug. 17, 2012).
ITU-T Recommendation G.9960, "Unified high-speed wireline-based home networking transceivers—System architecture and physical layer specification," *Int'l Telecommunication Union*, pp. 1-160 (Dec. 2011).
ITU-T Recommendation G.9960, Erratum 1 to Recommendation ITU-T G.9960, *Int'l Telecommunication Union*, 1 page (Jul. 2012).
ITU-T Recommendation G.9960, Erratum 2 to Recommendation ITU-T G.9960, *Int'l Telecommunication Union*, 4 pages (Sep. 2012).
Brown, "G.hn: Draft text for G.9960 (2010) corrigendum 1," *International Telecommunication Union*, pp. 1-184 (Feb. 2011).
Lee et al., "TGaf PHY proposal," *The Institute of Electrical and Electronics Engineers*, doc. No. IEEE 802.11-12/0809r5, pp. 1-43 (Jul. 10, 2012).
Vermani, et al. "Spec Framework Text for PHY Numerology," *The Institute of Electrical and Electronics Engineers*, doc. No. IEEE 802.11-11/1311r0, pp. 1-5 (Sep. 2011).
International Search Report and Written Opinion in International Application No. PCT/IB2014/002813, dated Jun. 11, 2015 (11 pages).
Lanoiselee et al., "Analog Front end Design for Gigabit Power Line Communication," 16th IEEE Int'l Symp. On Power Line Communications and Its Applications (ISPLC) 2012, Institute for Electrical and Electronics Engineers, 6 pages (Mar. 2012).
International Preliminary Report on Patentability in International Application No. PCT/IB2014/002813, dated Mar. 24, 2016 (9 pages).

\* cited by examiner

MULTIPLE TRANSMISSION WINDOWS FOR OFDM SYMBOL

CROSS-REFERENCES TO RELATED APPLICATIONS

This disclosure claims the benefit of the U.S. Provisional Patent Applications No. 61/875,356 entitled "Dual Transmission Window for OFDM," filed on Sep. 9, 2013, the disclosure of which is hereby incorporated by reference herein in its entirety.

FIELD OF THE DISCLOSURE

The present disclosure relates generally to communication networks and, more particularly, to multi-band data transmission systems and methods.

BACKGROUND

In most communication systems, increasing bandwidth translates into a greater transmission capacity. However, the physical medium or communication channel usually has some characteristics that vary in frequency, and only certain fragments or frequency bands can be used. For example, in an electrical grid, the power that can be injected starting from 30 MHz may vary in comparison to the power that can be injected at frequencies lower than 30 MHz. Also, an electrical grid has other characteristics that make an electrical grid less desirable as a transmission medium. For example, in an electrical grid, the noise floor decreases with the frequency, the attenuation increases with the frequency, and there is significant noise in the frequency-modulation (FM) radio band (from 88.5 to 108 MHz). Thus, there is a need to avoid certain parts of the frequency spectrum.

In the field of wireless communications, there is also a need to avoid certain parts of the frequency spectrum. In the context of Wireless Local Area Networks (WLAN), work has begun on a two new standards, IEEE 802.11ah and IEEE 802.11af, each of which will specify wireless network operation in sub-1 GHz frequencies. Low frequency communication channels are generally characterized by better propagation qualities and extended propagation ranges compared to transmission at higher frequencies. In the past, sub-1 GHz ranges have not been utilized for wireless communication networks because such frequencies were reserved for other applications (e.g., licensed TV frequency bands, radio frequency band, etc.). There are few frequency bands in the sub-1 GHz range that remain unlicensed, with different specific unlicensed frequencies in different geographical regions. The IEEE 802.11 ah Standard will specify wireless operation in available unlicensed sub-1 GHz frequency bands. The IEEE 802.11af Standard will specify wireless operation in TV White Space (TVWS), i.e., unused TV channels in sub-1 GHz frequency bands.

Thus, in both wired and wireless communication systems, it is necessary to configure the system to avoid certain bands of frequencies (e.g., a frequency band having a notch) so as to avoid interfering with other existing communication systems or to avoid frequencies at which the medium displays undesirable characteristics.

SUMMARY

Orthogonal frequency division multiplexing (OFDM) is an advantageous technique for communicating information over both wired and wireless communication systems. At least some embodiments disclosed herein mitigate problems related to generating OFDM symbols for information transmission in frequency bands in which some frequencies are to be avoided, e.g., contain notches. At least some disclosed embodiments allow for an optimization of system performance with respect to one or more metrics including, for example, one or more of: increased data throughput, minimization of inter-symbol interference (ISI), minimization of errors due to channel delay-spread, and minimization of power spectral density of bands at frequencies that are to be avoided.

In one embodiment, a method is generally directed to generating an orthogonal frequency division multiplexing (OFDM) symbol based on the use of different time domain windows for different spectral bands. The method includes receiving a plurality of information bits and mapping the plurality of information bits to (1) a first plurality of constellation symbols corresponding to a first plurality of OFDM subcarriers in the OFDM symbol, and (2) a second plurality of constellation symbols corresponding to a second plurality of OFDM subcarriers in the OFDM symbol. The method also includes generating a first time-domain signal by performing an Inverse Discrete Fourier Transform (IDFT) based on the first plurality of constellation symbols and generating a second time-domain signal by performing an IDFT based on the second plurality of constellation symbols. The method additionally includes modifying the first time-domain signal by applying a first window having a first width $\beta 1$, and modifying the second time-domain signal by applying a second window having a second width $\beta 2$, wherein the first width is different than the second width $\beta 2$ such that $\beta 1 \neq \beta 2$. The method further includes adding the first time-domain signal and the second time-domain signal to generate the OFDM symbol.

In a further embodiment, the first plurality of constellation symbols is generated to correspond to subcarriers having frequencies in a first band of frequencies containing a notch or adjacent to a notch, such that subcarriers in the notch carry reduced power spectral density in comparison to subcarriers not in the notch. Further, the second plurality of constellation symbols is generated to correspond to subcarriers having frequencies in a second band of frequencies that does not contain a notch.

In another embodiment, an apparatus is provided for generating an orthogonal frequency division multiplexing (OFDM) symbol based on the use of different time domain windows for different spectral bands. The apparatus includes a digital signal processor configured to include an input module, a constellation mapping module, an IDFT module, a windowing module, a signal addition module, and an output module. The input module is configured to receive a plurality of information bits and to provide these information bits to the constellation mapping module.

The constellation mapping module is configured to map the plurality of information bits to (1) a first plurality of constellation symbols corresponding to a first plurality of OFDM subcarriers in the OFDM symbol, and (2) a second plurality of constellation symbols corresponding to a second plurality of OFDM subcarriers in the OFDM symbol.

The IDFT module is configured to generate a first time-domain signal by performing an Inverse Discrete Fourier Transform (IDFT) based on the first plurality of constellation symbols, and to generate a second time-domain signal by performing an IDFT based on the second plurality of constellation symbols.

The windowing module is configured to modify the first time-domain signal by applying a first window having a first width β1, and to modify the second time-domain signal by applying a second window having a second width β2, wherein the first width is different than the second width β2 such that β1≠β2.

The signal addition module is configured to add the first time-domain signal and the second time-domain signal to generate the OFDM symbol, and the output module is configured to provide the OFDM symbol as output to a network interface, to a communications device, or to a non-transitory computer readable storage medium for storage of the OFDM symbol.

In further embodiments, a non-transitory computer readable storage medium having computer program instructions stored thereon is provided. The computer program instructions are such that, when executed by a processor, they cause the processor to perform a method of generating an orthogonal frequency division multiplexing (OFDM) symbol based on the use of different time domain windows for different spectral bands.

BRIEF DESCRIPTION OF THE DRAWINGS

Like reference symbols in the various drawings indicate like elements.

DETAILED DESCRIPTION

Embodiments disclosed herein are described in the context of communication systems that operate using frequency bands containing notches of forbidden frequencies. As such, embodiments described herein utilize a multi-band approach in which frequency components of a signal at frequency bands containing notches or at frequency bands adjacent to notches may be treated differently from other frequency components in the signal.

Example implementations are discussed below in the context of two frequency bands being considered, one with or adjacent to a notch and one without notches or not adjacent to notches. These examples are presented merely for the purpose of illustration and are not limiting. One of ordinary skill in the art, upon reading the present disclosure, will appreciate that techniques discussed herein may be utilized in the context of more than two frequency bands.

Figure 1:
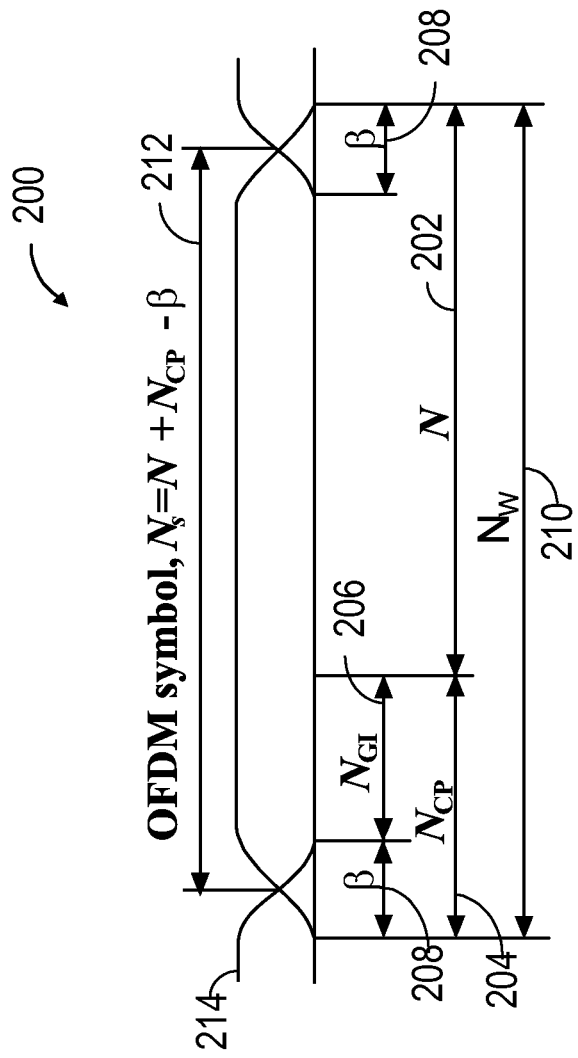
FIG. 1 illustrates one way in which OFDM symbols may be windowed and overlapped, as is done, for example, in the ITU-T G.hn standard.

Many communication systems that use OFDM, for example systems that conform to the International Telecommunication Union's (ITU's) G.hn family of standards, very-high-bit-rate digital subscriber line (VDSL) communication, etc., define the use of a transmission window. FIG. 1 illustrates an OFDM symbol 200 that is overlapped with other OFDM symbols, as is done, for example, in the ITU-T G.hn standard. The OFDM signal 200 is formed from an original data signal having a time duration N (202). In forming the OFDM symbol 200, the original data signal is modified to include a cyclic prefix having a time duration $N_{CP}$ (204), thus creating an extended signal having a duration 210. A windowing function is applied to the extended signal to create transition periods 208, each having a duration β. A guard interval (GI) 206 is a time interval between an end of a preceding OFDM symbol 214 and a beginning of the original OFDM symbol. After windowing and overlapping with adjacent OFDM symbols, the OFDM symbol 200 has a duration 212 given by $Ns=N+N_{CP}-β$.

A smoother transition between symbols provides a sharper spectrum in frequency, which may be especially important in cases in which notches in the spectrum are required in order to coexist with, for example, HAM radio services and/or to avoid undesirable characteristics of the transmission medium. U.S. Pat. Nos. 7,483,365 and 8,265,176 discuss issues related to power line communication systems coexisting with HAM radio services.

As the window width, β, increases, the sharpness of notches in a frequency spectrum generally increase. The presence of the window, however, increases the symbol duration and thus reduces the throughput. Additionally, as compared to an OFDM symbol with the same symbol duration 212 but no windowing, the windowing reduces the ability of the Guard Interval 206 to mitigate the channel delay-spread and to reduce inter symbol interference (ISI).

Figure 2:
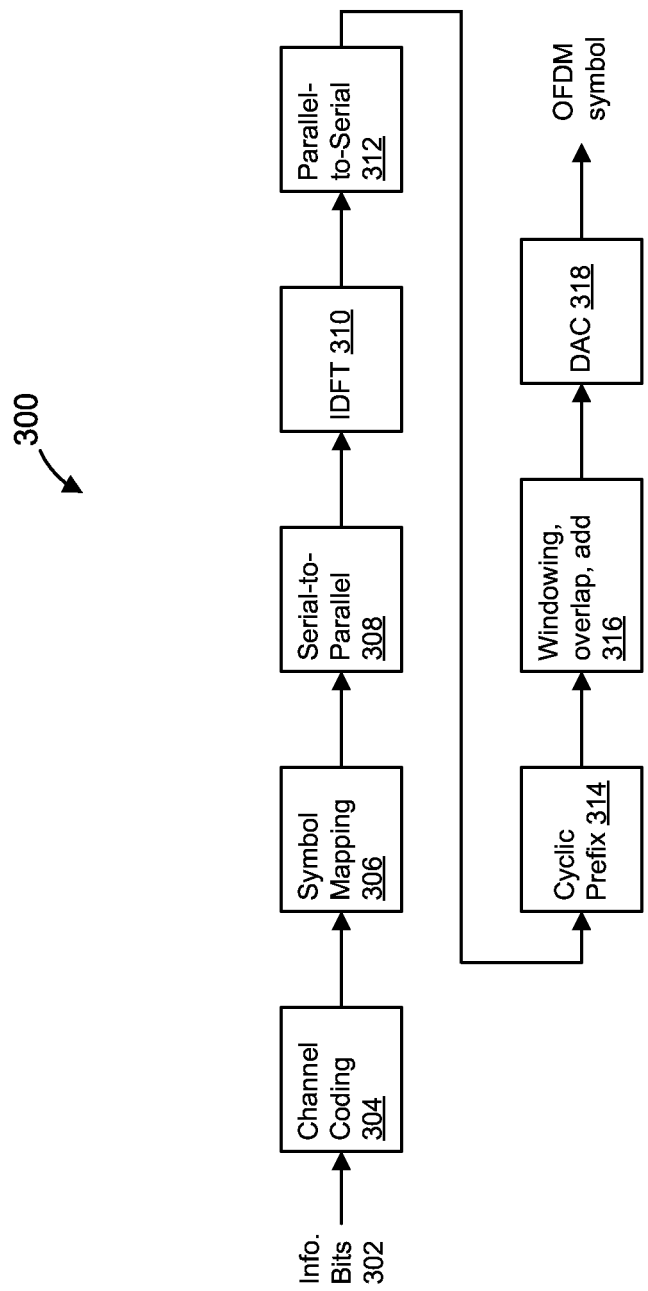
FIG. 2 illustrates an example transmission block diagram of a conventional OFDM system using a windowing and overlap scheme as shown in FIG. 1.

FIG. 2 is a block diagram of an example transmitter 300 of a conventional OFDM system using a windowing and overlap scheme such as discussed above with respect to FIG. 1. Information bits 302 are received by the transmitter 300 and are provided to a channel coding module 304 configured to implement channel coding. A symbol mapping module 306 maps encoded bits to constellation points, e.g., the symbol mapping module 306 maps encoded bits to transmission symbols according to a suitable modulation scheme such as binary phase shift keying (BPSK), quadrature amplitude modulation (QAM), etc. The resulting constellation points are provided to a serial to parallel module 308 that parses constellation points to different inputs of an IDFT module 310 that performs an Inverse Discrete Fourier Transform (IDFT), e.g., an inverse fast Fourier transform (IFFT). The different inputs of the IDFT module 310 correspond to different OFDM subchannels. An output of the IDFT module 310 is provided to a parallel to serial module 312 that generates a time-domain signal. The output of the parallel to serial module 312 is provided to a cyclic prefix module 314 which adds a cyclic prefix to the time-domain signal. A windowing function is then applied by a windowing module 316. Finally an analog representation of the OFDM symbol is generated by a digital to analog converter (DAC) 318.

Since the windowing function is applied in the time domain (e.g., after the IFFT), in such a conventional system, the windowing function is the same for all the subcarriers in the time domain signal. In other words, the transition period corresponding to the windowing function is the same for all the subcarriers in the time domain signal.

The subcarriers that contribute the most to the power spectral density in a notch are the subcarriers that are relatively closer (in frequency) to the notch, whereas subcarriers relatively farther (in frequency) from the notch contribute less to the power spectral density in a notch. Thus, unlike the transmitter 300 of FIG. 2, embodiments described below apply a first windowing function for subcarriers that are relatively close (in frequency) to a notch and apply a second windowing function corresponding to a shorter transition period (or no windowing is applied) to subcarriers that are relatively farther (in frequency) from the notch.

Figure 3:
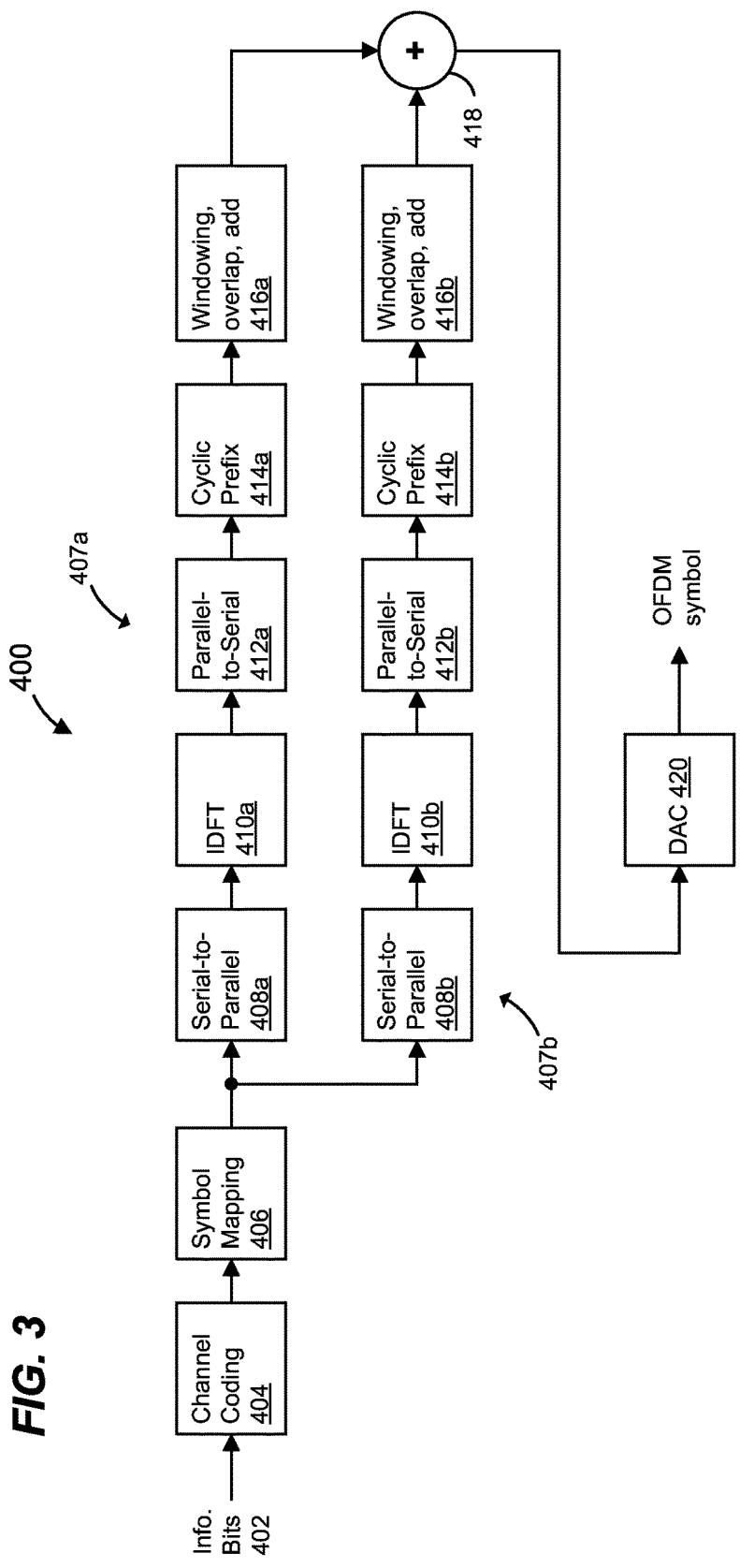
FIG. 3 illustrates an apparatus for applying windows of different time duration to subcarriers corresponding to different frequency bands, according to an embodiment.

FIG. 3 is a block diagram of an example transmitter apparatus 400, according to an embodiment. As described in more detail below, the transmitter 400 applies different windowing functions corresponding to different transition time durations to subcarriers corresponding to different frequency bands.

Information bits 402 are provided to a channel coding module 404, which encodes the information bits 402 to generate encoded bits. Symbol mapping is performed by a symbol mapping module 406. The symbol mapping module 406 maps encoded bits to constellation points, e.g., the symbol mapping module 406 maps encoded bits to transmission symbols according to a suitable modulation scheme such as BPSK, QAM, etc.

The constellation points are parsed to one of two transmit chains 407, where each transmit chain 407 corresponds to a respective subset of subchannels. For example, in an embodiment, the transmit chain 407a corresponds to a first subset of subchannels relatively closer, in frequency, (e.g., as compared to other subchannels not in the first subset) to a notch and for which a first windowing function is to be applied, where the first windowing function corresponds to a relatively longer transition period (e.g., as compared to a second windowing function applied to other subchannels or to no windowing function); whereas the transmit chain 407b corresponds to a second subset of subchannels relatively farther, in frequency, (e.g., as compared to the first subset of channels) from the notch and for which a second windowing function (or no windowing function) is to be applied, where the second windowing function corresponds to a relatively shorter transition period (e.g., as compared to the first windowing function).

The transmit chain 407a includes a serial to parallel module 408a, an IDFT module 410a, a parallel to serial module 412a, a cyclic prefix generation module 414a, and a windowing module 416a. Similarly, the transmit chain 407b includes a serial to parallel module 408b, an IDFT module 410b, a parallel to serial module 412b, a cyclic prefix generation module 414b, and a windowing module 416b. Each transmit chain 407 operates in a manner similar to corresponding modules in the transmitter 300 of FIG. 2, except that each transmit chain 407 operates to generate a respective time domain signal corresponding to only a respective subset of subchannels. Additionally, the windowing module 416a applies a first windowing function, whereas the windowing module 416b applies a second windowing function. In an embodiment, no windowing function is applied by the transmit chain 407b and the windowing module 416b is omitted or bypassed. In an embodiment, the first windowing function corresponds to a longer transition period as compared to the second windowing function. In an embodiment, both transmit chains 407 use a same OFDM symbol duration (e.g., Ns 212 as described with reference to FIG. 1) so that the time domain signals generated by the chains 407 are correctly aligned in time.

Time-domain signals generated by the transmit chains 407 are summed by a summing module 418. A DAC 420 converts the summed signal to an analog signal.

The transmitter apparatus 400 of FIG. 3 may be implemented using dedicated transmit chains 407. In other embodiments, however, in which a communication device utilizes more chains in reception than in transmission, processing resources that would otherwise remain idle during transmission (e.g., processing resources utilized for additional receive chains) may be utilized to implement transmit chain 407b, for example, during transmission. U.S. Patent Application Publication No. 2012/0134375, entitled "Multi-Band Data Transmission," which is incorporated herein by reference, describes how processing resources in a communication device can be time-shared between a transmit mode and a receive mode. Similarly, U.S. patent application Ser. No. 14/180,178, entitled "Multi-Band Transmission System," which is incorporated herein by reference, describes how processing resources in a communication device can be time-shared between a transmit mode and a receive mode.

In some embodiments it may be advantageous to reduce the GI between OFDM symbols so that a window transition in subcarriers close to a notch may be longer than the GI, while a window transition for other subcarriers, e.g., subcarriers relatively further from the notch, is shorter than the GI. Due to the window transition being longer than the GI for some subcarriers there may be distortion in the vicinity of the subcarriers with the long window transition (e.g., because the flat part of the window may be shorter than N), but the other subcarriers will have no such distortion and hence will have a higher signal to noise ratio (SNR).

In some embodiments it may be advantageous to reduce the window transition duration for subcarriers far from a notch to increase the effective GI and eliminate more ISI, while keeping a longer window duration just at or below the duration of the GI for subcarriers closer to the notch.

In some embodiments, the transmitter apparatus 400 is modified to include a suitable number of transmit chains 407 more than two, e.g., three transmit chains 407, four transmit chains 407, five transmit chains 407, etc. In such embodiments, the summing module 418 is modified to sum outputs from the multiple transmit chains 407. In some embodiments, one or more of the transmit chains 407 may omit applying a windowing function.

Figure 4:
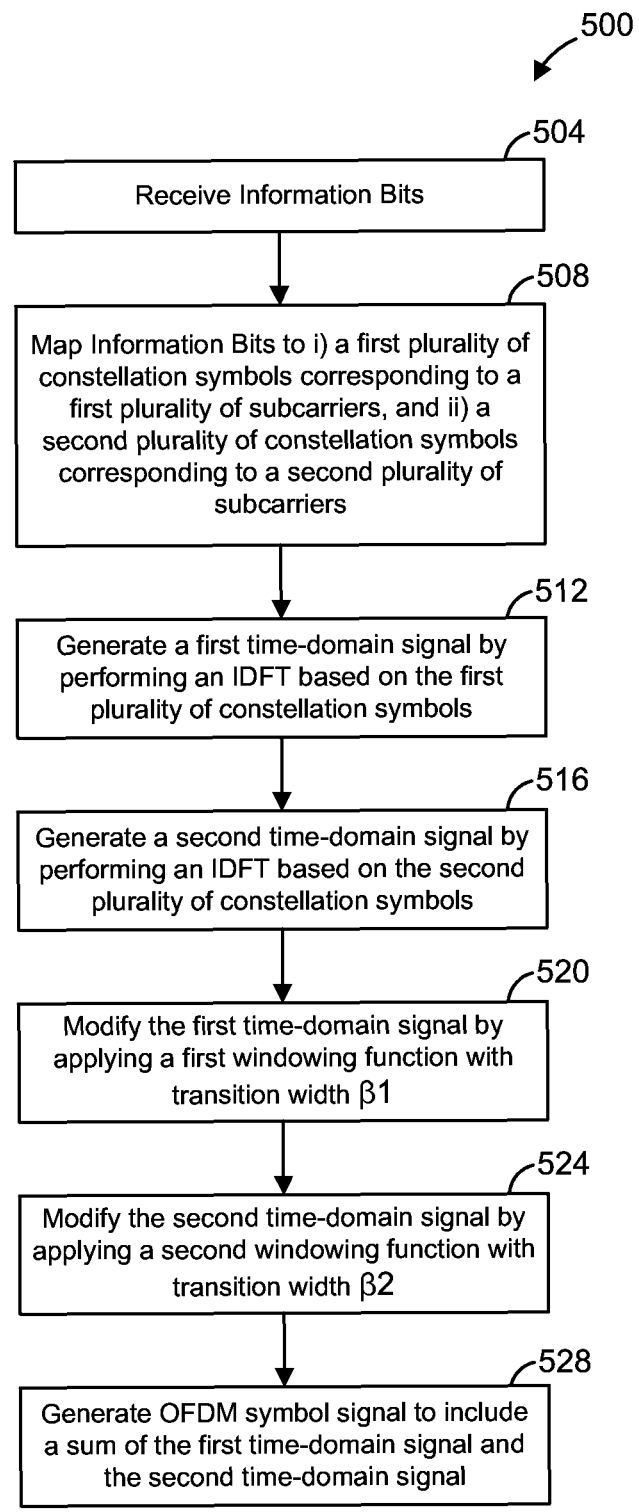
FIG. 4 illustrates a method for generating an OFDM symbol based on the use of different time domain windows for different spectral bands, according to an embodiment.

FIG. 4 is a flow diagram of an example method 500 for generating an OFDM symbol, according to an embodiment. The method 500 may be implemented by the example transmitter apparatus 400 of FIG. 3, in an embodiment, and the method 500 is discussed with reference to FIG. 3 merely for explanatory purposes. In other embodiments, however, the method 500 is implemented by another suitable apparatus.

At block 504, a plurality of information bits are received. In an embodiment, the plurality of information bits are for inclusion in an OFDM symbol.

At block 508, information bits received at block 504 are mapped to i) a first plurality of constellation symbols (sometimes referred to herein as constellation points) corresponding to a first plurality of OFDM subcarriers, and ii) a second plurality of constellation symbols corresponding to a second plurality of OFDM subcarriers. For example, in the transmitter apparatus 400, the symbol mapping module 406 and the serial-to-parallel modules 408 map information bits (e.g., after having been encoded) to i) a first plurality of constellation points corresponding to a first plurality of OFDM subcarriers, and ii) a second plurality of constellation symbols corresponding to a second plurality of OFDM subcarriers.

At block 512, a first time-domain signal is generated by performing an IDFT on the first plurality of constellation symbols. For example, in the transmitter apparatus 400, the IDFT module 410a performs an IDFT on the first plurality of constellation points. Similarly, at block 516, a second time-domain signal is generated by performing an IDFT on the second plurality of constellation symbols. For example, in the transmitter apparatus 400, the IDFT module 410b performs an IDFT on the second plurality of constellation points.

At block 520, the first time-domain signal is modified by applying a first windowing function corresponding to a transition width β1. For example, in the transmitter apparatus 400, the windowing module 416a applies a first windowing function. Similarly, at block 524, the second time-domain signal is modified by applying a second windowing function corresponding to a transition width $\beta2$. For example, in the transmitter apparatus 400, the windowing module 416b applies a second windowing function. In some embodiments, $\beta1 \ne \beta2$. In some embodiments in which the first plurality of subcarriers are closer in frequency to a notch as compared to the second plurality of subcarriers, $\beta1 > \beta2$.

In some embodiments, the first windowing function has a different shape than the second windowing function. For example, in an embodiment, the first windowing function has a first shape selected from a set of suitable shapes including two or more of i) a raised cosine shape, ii) a triangular shape, iii) a hamming window shape, etc.; whereas the second windowing function has a second shape selected from the set of suitable shapes, where the first shape is different than the second shape. In other embodiments, the first shape and the second shape are the same.

At block 528, the OFDM symbol is generated to include a sum of the first time-domain signal and the second time-domain signal. For example, in the transmitter apparatus 400, time-domain signals generated by the chains 407 are summed by the summing module 418, and the DAC 420 converts the summed signal to an analog signal.

In some embodiments, the method 500 is modified to include additional processing blocks such as discussed above, e.g., GI insertion, cyclic prefix insertion, generation of additional time-domain signals, etc. In some embodiments, block 524 is omitted such that no windowing function is applied to the second time-domain signal.

In some embodiments, a data stream is produced by generating a plurality of ODFM symbols according to initial values of $\beta1$, $N1_{CP}$, $\beta2$, $N2_{CP}$ and overlapping the symbols as described above. The generated data stream can be characterized in terms of its throughput, inter-symbol interference (ISI), rate of errors resulting from channel delay-spread, as well as by the value of the power spectral density in bands lying within the notch. An optimization procedure can be performed by varying the values of $\beta1$, $N1_{CP}$, $\beta2$, $N2_{CP}$ so as to optimize one or more metrics of the data stream. For example, the optimization procedure may, in various embodiments, involve any suitable combination of one or more of the following:

maximize data throughput to be greater than a predetermined throughput value;
minimize power spectral density of bands in the notch to be less than a predetermined spectral density value;
minimize inter-symbol interference (ISI) to be lower than a predetermined amount; and
minimize errors due to channel delay-spread.

In a further embodiment, it may be advantageous to set the first window width $\beta1$ to be longer than the guard window width $N_{GI}$ such that $\beta1 > N_{GI}$, and to set the second window width $\beta2$ to be shorter than the guard window width $N_{GI}$ such that $\beta2 \le N_{GI}$. For certain applications, this particular choice may have beneficial effects for an optimization procedure such as described above.

In further embodiments, a non-transitory computer readable storage medium having computer program instructions stored thereon is provided. The computer program instructions are such that, when executed by a processor, they cause the processor to perform a method of generating an orthogonal frequency division multiplexing (OFDM) symbol based on the use of different time domain windows for different spectral bands, as described above with regard to FIGS. 3 and 4.

In an embodiment, a method of generating an orthogonal frequency division multiplexing (OFDM) symbol includes receiving a plurality of information bits; mapping the plurality of information bits to: (i) a first plurality of constellation symbols corresponding to a first plurality of OFDM subcarriers in the OFDM symbol, and (ii) a second plurality of constellation symbols corresponding to a second plurality of OFDM subcarriers in the OFDM symbol. The method further includes: generating a first time-domain signal by performing an Inverse Discrete Fourier Transform (IDFT) based on the first plurality of constellation symbols; generating a second time-domain signal by performing an IDFT based on the second plurality of constellation symbols; modifying the first time-domain signal by applying a first windowing function corresponding to a first transition width $\beta1$; modifying the second time-domain signal by applying a second windowing function having a second transition width $\beta2$, wherein the first transition width $\beta1$ is different than the second transition width $\beta2$ such that $\beta1 \ne \beta2$; and generating an output signal to include a sum of the first time-domain signal and the second time-domain signal, the output signal corresponding to the OFDM symbol.

In other embodiments, the method includes none of, one of, or any suitable combination of two or more of the following features.

The first plurality of OFDM subcarriers correspond to a first frequency band containing or adjacent to a notch in which signal power corresponding to the OFDM symbol is to be minimized; and the second plurality of OFDM subcarriers correspond to a second frequency band that is further in frequency from the notch as compared to the first frequency band.

The first transition width $\beta1$ is longer than the second transition width $\beta2$ such that $\beta1 > \beta2$.

The method further includes modifying the first time-domain signal to include a first cyclic prefix having a first width $N1_{CP}$; modifying the second time-domain signal to include a second cyclic prefix having a width $N2_{CP}$; and setting the first window width $\beta1$, the second window width $\beta2$, first width $N1_{CP}$, and the second width $N2_{CP}$ so that the first and second time-domain signals each have a common OFDM symbol duration.

The method further includes generating a first plurality of OFDM symbols according to initial values of $\beta1$, $N1_{CP}$, $\beta2$, $N2_{CP}$; after generating the first plurality of OFDM symbols, changing one or more of the values of $\beta1$, $N1_{CP}$, $\beta2$, $N2_{CP}$; and after changing one or more of the values of $\beta1$, $N1_{CP}$, $\beta2$, $N2_{CP}$, generating a second plurality of OFDM symbols according to one or more changed values of $\beta1$, $N1_{CP}$, $\beta2$, $N2_{CP}$.

Changing one or more of the values of $\beta1$, $N1_{CP}$, $\beta2$, $N2_{CP}$ is performed as part of an optimization procedure to, at least one of: maximize data throughput to be greater than a predetermined throughput value; minimize power spectral density in the notch to be less than a predetermined spectral density value; minimize inter-symbol interference (ISI) to be lower than a predetermined amount; and/or minimize errors due to channel delay-spread.

The method further includes setting the first window transition width $\beta1$ to be longer than a guard interval width $N_{GI}$ such that $\beta1 > N_{GI}$; and setting the second window transition width $\beta2$ to be shorter than the guard interval width $N_{GI}$ such that $\beta2 \le N_{GI}$.

In another embodiment, an apparatus comprises one or more integrated circuit devices configured to: receive a plurality of information bits, map the plurality of information bits to: (i) a first plurality of constellation symbols corresponding to a first plurality of orthogonal frequency division multiplexing (OFDM) subcarriers in an OFDM symbol, and (ii) a second plurality of constellation symbols corresponding to a second plurality of OFDM subcarriers in the OFDM symbol. The one or more integrated circuit devices are also configured to: generate a first time-domain signal by performing an Inverse Discrete Fourier Transform (IDFT) based on the first plurality of constellation symbols, generate a second time-domain signal by performing an IDFT based on the second plurality of constellation symbols, modify the first time-domain signal by applying a first windowing function corresponding to a first transition width $\beta 1$, modify the second time-domain signal by applying a second windowing function having a second transition width $\beta 2$, wherein the first transition width $\beta 1$ is different than the second transition width $\beta 2$ such that $\beta 1 \neq \beta 2$, and generate an output signal to include a sum of the first time-domain signal and the second time-domain signal, the output signal corresponding to the OFDM symbol.

In other embodiments, the apparatus includes none of, one of, or any suitable combination of two or more of the following features.

The first plurality of OFDM subcarriers correspond to a first frequency band containing or adjacent to a notch in which signal power corresponding to the OFDM symbol is to be minimized; and the second plurality of OFDM subcarriers correspond to a second frequency band that is further in frequency from the notch as compared to the first frequency band.

The first transition width $\beta 1$ is longer than the second transition width $\beta 2$ such that $\beta 1 > \beta 2$.

The one or more integrated circuit devices are configured to: modify the first time-domain signal to include a first cyclic prefix having a first width $N1_{CP}$; modify the second time-domain signal to include a second cyclic prefix having a width $N2_{CP}$; and set the first window width $\beta 1$, the second window width $\beta 2$, first width $N1_{CP}$, and the second width $N2_{CP}$ so that the first and second time-domain signals each have a common symbol duration.

The one or more integrated circuit devices are configured to: generate a first plurality of OFDM symbols according to initial values of $\beta 1$, $N1_{CP}$, $\beta 2$, $N2_{CP}$; after generating the first plurality of OFDM symbols, change one or more of the values of $\beta 1$, $N1_{CP}$, $\beta 2$, $N2_{CP}$; and after changing one or more of the values of $\beta 1$, $N1_{CP}$, $\beta 2$, $N2_{CP}$, generate a second plurality of OFDM symbols according to one or more changed values of $\beta 1$, $N1_{CP}$, $\beta 2$, $N2_{CP}$.

The one or more integrated circuit devices are configured to change one or more of the values of $\beta 1$, $N1_{CP}$, $\beta 2$, $N2_{CP}$ as part of an optimization procedure to, at least one of: maximize data throughput to be greater than a predetermined throughput value; minimize power spectral density in the notch to be less than a predetermined spectral density value; minimize inter-symbol interference (ISI) to be lower than a predetermined amount; and/or minimize errors due to channel delay-spread.

The one or more integrated circuit devices are configured to: set the first window transition width $\beta 1$ to be longer than a guard interval width $N_{GI}$ such that $\beta 1 > N_{GI}$; and set the second window transition width $\beta 2$ to be shorter than the guard interval width $N_{GI}$ such that $\beta 2 \leq N_{GI}$.

The one or more integrated circuit devices implement: a symbol mapping module configured to map information bits in the plurality of information bits to constellation symbols, a first serial-to-parallel module coupled to the symbol mapping module, the first serial-to-parallel module outputting the first plurality of constellation symbols, and a second serial-to-parallel module coupled to the symbol mapping module, the second serial-to-parallel module outputting the second plurality of constellation symbols.

The one or more integrated circuit devices implement: a first inverse discrete Fourier transform (IDFT) module configured to operate on the first plurality of constellation symbols, a first parallel-to-serial module coupled to the first IDFT module, the first parallel-to-serial module outputting the first time-domain signal, a second IDFT module configured to operate on the second plurality of constellation symbols, and a second parallel-to-serial module coupled to the second IDFT module, the second parallel-to-serial module outputting the second time-domain signal.

The apparatus further comprises a digital-to-analog convert to convert the output signal to an analog signal.

In another embodiment, a non-transitory computer readable storage medium having computer program instructions stored thereon that, when executed by one or more processors, cause the one or more processors to perform a method of generating an orthogonal frequency division multiplexing (OFDM) symbol, the method comprising: receiving a plurality of information bits; mapping the plurality of information bits to: (i) a first plurality of constellation symbols corresponding to a first plurality of OFDM subcarriers in the OFDM symbol, and (ii) a second plurality of constellation symbols corresponding to a second plurality of OFDM subcarriers in the OFDM symbol. The method further comprises generating a first time-domain signal by performing an Inverse Discrete Fourier Transform (IDFT) based on the first plurality of constellation symbols; generating a second time-domain signal by performing the IDFT based on the second plurality of constellation symbols; modifying the first time-domain signal by applying a first windowing function corresponding to a first transition having a first width $\beta 1$; modifying the second time-domain signal by applying a second windowing function corresponding to a second transition having a second width $\beta 2$, wherein the first width $\beta 1$ is different than the second width $\beta 2$ such that $\beta 1 \neq \beta 2$; and adding the first time-domain signal and the second time-domain signal to generate an output signal corresponding to the OFDM symbol.

In other embodiments, the storage medium includes none of, one of, or any suitable combination of two or more of the following features.

The storage further comprises computer program instructions stored thereon that, when executed by a processor, cause the processor to perform the following method steps: the first plurality of OFDM subcarriers correspond to a first frequency band containing or adjacent to a notch in which signal power corresponding to the OFDM symbol is to be minimized; and the second plurality of OFDM subcarriers correspond to a second frequency band that is further in frequency from the notch as compared to the first frequency band.

The first transition width $\beta 1$ is longer than the second transition width $\beta 2$ such that $\beta 1 > \beta 2$.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any tangible, non-transitory computer readable memory such as on a magnetic disk, an optical disk, or other storage medium, in a RAM or ROM or flash memory, processor, hard disk drive, optical disk drive, tape drive, etc.

Likewise, the software or firmware instructions may be delivered to a user or a system via any known or desired delivery method including, for example, on a computer readable disk or other transportable computer storage mechanism or via communication media.

Thus, the software or firmware instructions may be delivered to a user or a system via a communication channel such as a telephone line, a DSL line, a cable television line, a fiber optics line, a wireless communication channel, the Internet, etc. The software or firmware instructions may include machine readable instructions that, when executed by the processor, cause the processor to perform various acts.

When implemented in hardware, the hardware may comprise one or more of discrete components, an integrated circuit, an application-specific integrated circuit (ASIC), a programmable logic device, etc.

While the present invention has been described with reference to specific examples, which are intended to be illustrative only and not to be limiting of the invention, changes, additions and/or deletions may be made to the disclosed embodiments without departing from the scope of the claims.

What is claimed is:

1. A method of generating an orthogonal frequency division multiplexing (OFDM) symbol for transmission in a communication channel containing one or more notches of forbidden frequencies, the method comprising:
   receiving a plurality of information bits;
   mapping the plurality of information bits to a plurality of constellation symbols corresponding to a plurality of OFDM subcarriers in the OFDM symbol, the plurality of constellation symbols including:
      (i) a first set of constellation symbols corresponding to a first set of OFDM subcarriers in the OFDM symbol, wherein the first set of OFDM subcarriers includes i) one or more OFDM subcarriers in the one or more notches, and ii) one or more OFDM subcarriers adjacent to the one or more notches where the one or more OFDM subcarriers adjacent to the one or more notches include at least some of the plurality of information bits, and
      (ii) a second set of constellation symbols corresponding to a second set of OFDM subcarriers in the OFDM symbol, wherein the second set of OFDM subcarriers are further in frequency from the one or more notches than the first set of OFDM subcarriers;
   generating a first time-domain signal by performing an Inverse Discrete Fourier Transform (IDFT) based on the first set of constellation symbols;
   generating a second time-domain signal by performing an IDFT based on the second set of constellation symbols;
   modifying the first time-domain signal by applying a first windowing function corresponding to a first window transition width $\beta 1$;
   modifying the second time-domain signal by applying a second windowing function having a second window transition width $\beta 2$, wherein the first window transition width $\beta 1$ is different than the second window transition width $\beta 2$ such that $\beta 1 \neq \beta 2$;
   setting the first window transition width $\beta 1$ to be longer than a guard interval width $N_{GI}$ such that $\beta 1 > N_{GI}$;
   setting the second window transition width $\beta 2$ to be shorter than the guard interval width $N_{GI}$ such that $\beta 2 < N_{GI}$; and
   generating an output signal to include a sum of the first time-domain signal and the second time-domain signal, the output signal corresponding to the OFDM symbol.

2. The method of claim 1, further comprising:
   modifying the first time-domain signal to include a first cyclic prefix having a first width $N1_{CP}$;
   modifying the second time-domain signal to include a second cyclic prefix having a width $N2_{CP}$; and
   setting the first window width $\beta 1$, the second window width $\beta 2$, first width $N1_{CP}$, and the second width $N2_{CP}$ where the first and second time-domain signals each have a common OFDM symbol duration.

3. The method of claim 2, further comprising:
   generating a first plurality of OFDM symbols according to initial values of $\beta 1$, $N1 CP$, $\beta 2$, $N2_{CP}$;
   after generating the first plurality of OFDM symbols, changing one or more of the values of $\beta 1$, $N1_{CP}$, $\beta 2$, $N2_{CP}$; and
   after changing one or more of the values of $\beta 1$, $N1_{CP}$, $\beta 2$, $N2_{CP}$, generating a second plurality of OFDM symbols according to one or more changed values of $\beta 1$, $N1_{CP}$, $\beta 2$, $N2_{CP}$.

4. The method of claim 3, wherein changing one or more of the values of $\beta 1$, $N1_{CP}$, $\beta 2$, $N2_{CP}$ is performed as part of an optimization procedure to, at least one of:
   maximize data throughput to be greater than a predetermined throughput value;
   minimize power spectral density in the notch to be less than a predetermined spectral density value;
   minimize inter-symbol interference (ISI) to be lower than a predetermined amount; and/or
   minimize errors due to channel delay-spread.

5. An apparatus, comprising:
   one or more integrated circuit devices configured to:
      receive a plurality of information bits,
      map the plurality of information bits to a plurality of constellation symbols corresponding to a plurality of orthogonal frequency division multiplexing (OFDM) subcarriers in an OFDM symbol for transmission in a communication channel containing one or more notches of forbidden frequencies, the plurality of constellation symbols including:
         (i) a first set of constellation symbols corresponding to a first set of OFDM subcarriers in the OFDM symbol, wherein the first set of OFDM subcarriers includes i) one or more OFDM subcarriers in the one or more notches, and ii) one or more OFDM subcarriers adjacent to the one or more notches where the one or more OFDM subcarriers adjacent to the one or more notches include at least some of the plurality of information bits, and
         (ii) a second set of constellation symbols corresponding to a second set of OFDM subcarriers in the OFDM symbol, wherein the second set of OFDM subcarriers are further in frequency from the one or more notches than the first set of OFDM subcarriers,
      generate a first time-domain signal by performing an Inverse Discrete Fourier Transform (IDFT) based on the first set of constellation symbols,
      generate a second time-domain signal by performing an IDFT based on the second set of constellation symbols,
      modify the first time-domain signal by applying a first windowing function corresponding to a first window transition width $\beta 1$,
      modify the second time-domain signal by applying a second windowing function having a second window transition width $\beta 2$, wherein the first window transition width β1 is different than the second window transition width β2 such that β1≠β2,
set the first window transition width β1 to be longer than a guard interval width $N_{GI}$ such that β1>$N_{GI}$,
set the second window transition width β2 to be shorter than the guard interval width $N_{GI}$ such that β2<$N_{GI}$, and
generate an output signal to include a sum of the first time-domain signal and the second time-domain signal, the output signal corresponding to the OFDM symbol.

6. The apparatus of claim 5, wherein the one or more integrated circuit devices are configured to:
modify the first time-domain signal to include a first cyclic prefix having a first width $N1_{CP}$;
modify the second time-domain signal to include a second cyclic prefix having a width $N2_{CP}$; and
set the first window width β1, the second window width β2, first width $N1_{CP}$, and the second width $N2_{CP}$ where the first and second time-domain signals each have a common symbol duration.

7. The apparatus of claim 6, wherein the one or more integrated circuit devices are configured to:
generate a first plurality of OFDM symbols according to initial values of β1, $N1_{CP}$, β2, $N2_{CP}$;
after generating the first plurality of OFDM symbols, change one or more of the values of β1, $N1_{CP}$, β2, $N2_{CP}$; and
after changing one or more of the values of β1, $N1_{CP}$, β2, $N2_{CP}$, generate a second plurality of OFDM symbols according to one or more changed values of β1, $N1_{CP}$, β2, $N2_{CP}$.

8. The apparatus of claim 7, wherein the one or more integrated circuit devices are configured to change one or more of the values of β1, $N1_{CP}$, β2, $N2_{CP}$ as part of an optimization procedure to, at least one of:
maximize data throughput to be greater than a predetermined throughput value;
minimize power spectral density in the notch to be less than a predetermined spectral density value;
minimize inter-symbol interference (ISI) to be lower than a predetermined amount; and/or
minimize errors due to channel delay-spread.

9. The apparatus of claim 6, wherein the one or more integrated circuit devices implement:
a symbol mapping module configured to map information bits in the plurality of information bits to constellation symbols,
a first serial-to-parallel module coupled to the symbol mapping module, the first serial-to-parallel module outputting the first plurality of constellation symbols, and
a second serial-to-parallel module coupled to the symbol mapping module, the second serial-to-parallel module outputting the second plurality of constellation symbols.

10. The apparatus of claim 6, wherein the one or more integrated circuit devices implement:
a first inverse discrete Fourier transform (IDFT) module configured to operate on the first plurality of constellation symbols,
a first parallel-to-serial module coupled to the first IDFT module, the first parallel-to-serial module outputting the first time-domain signal,
a second IDFT module configured to operate on the second plurality of constellation symbols, and
a second parallel-to-serial module coupled to the second IDFT module, the second parallel-to-serial module outputting the second time-domain signal.

11. The apparatus of claim 6, further comprising a digital-to-analog convert to convert the output signal to an analog signal.

12. A non-transitory computer readable storage medium having computer program instructions stored thereon that, when executed by one or more processors, cause the one or more processors to perform a method of generating an orthogonal frequency division multiplexing (OFDM) symbol for transmission in a communication channel containing one or more notches of forbidden frequencies, the method comprising:
receiving a plurality of information bits;
mapping the plurality of information bits to a plurality of constellation symbols corresponding to a plurality of OFDM subcarriers in the OFDM symbol, the plurality of constellation symbols including:
(i) a first set of constellation symbols corresponding to a first set of OFDM subcarriers in the OFDM symbol, wherein the first set of OFDM subcarriers includes i) one or more OFDM subcarriers in the one or more notches, and ii) one or more OFDM subcarriers adjacent to the one or more notches where the one or more OFDM subcarriers adjacent to the one or more notches include at least some of the plurality of information bits, and
(ii) a second set of constellation symbols corresponding to a second set of OFDM subcarriers in the OFDM symbol, wherein the second set of OFDM subcarriers are further in frequency from the one or more notches than the first set of OFDM subcarriers;
generating a first time-domain signal by performing an Inverse Discrete Fourier Transform (IDFT) based on the first set of constellation symbols;
generating a second time-domain signal by performing the IDFT based on the second set of constellation symbols;
modifying the first time-domain signal by applying a first windowing function corresponding to a first transition having a first window transition width β1;
modifying the second time-domain signal by applying a second windowing function corresponding to a second transition having a second window transition width β2, wherein the first window transition width β1 is different than the second window transition width β2 such that β1≠β2;
setting the first window transition width β1 to be longer than a guard interval width $N_{GI}$ such that β1>$N_{GI}$;
setting the second window transition width β2 to be shorter than the guard interval width $N_{GI}$ such that β2<$N_{GI}$; and
adding the first time-domain signal and the second time-domain signal to generate an output signal corresponding to the OFDM symbol.

* * * * *